United States Patent [19]
Elko et al.

[11] Patent Number: 4,894,749
[45] Date of Patent: Jan. 16, 1990

[54] OPTION SLOT FILLER BOARD

[75] Inventors: Gary W. Elko, Summit, N.J.; Paul Howard, Hinsdale, Ill.; Daniel A. Quinlan, Andover, Mass.

[73] Assignees: AT&T Information Systems Inc American Telephone and Telegraph Company, New York, N.Y.; AT&T Information Systems, Morristown; AT&T Bell Laboratories, Murray Hill, both of N.J.

[21] Appl. No.: 91,244

[22] Filed: Aug. 31, 1987

[51] Int. Cl.$^4$ .......................... H05K 7/20; H02K 5/24
[52] U.S. Cl. .............................. 361/383; 165/104.33; 181/202; 181/225; 361/384; 361/391; 361/415
[58] Field of Search ............... 181/198, 202, 205, 225; 361/382, 383, 384, 390, 391, 395, 413, 415, 424; 174/35 R, 51

[56] References Cited

U.S. PATENT DOCUMENTS 4,186,422  1/1980  Laermer ............................. 361/388
4,399,485  8/1983  Wright et al. ...................... 361/383

OTHER PUBLICATIONS

Lockhart et al., "Multifunctional Composite Panel", IBM Technical Disclosure Bulletin, vol. 19, No. 10, 3/77, pp. 3785-3786.
Cha, "Air-Cooling Scheme Having Enhanced Acoustic Performance", IBM Technical Disclosure Bulletin, vol. 22, No. 3, 8/79, pp. 1108-1109.
DeSilva et al., "Low Noise Air Moving Chamber for an Electronic Apparatus Enclosure", IBM Technical Disclosure Bulletin, vol. 20, No. 4, 9/77, p. 1336.
J. S. Hanson, "Environmental Test Chamber for Circuit Card", *IBM Technical Disclosure Bulletin*, vol. 20, No. 5(10-77), pp. 1837-1838.

*Primary Examiner*—Gregory D. Thompson
*Attorney, Agent, or Firm*—David Volejnicek

[57] ABSTRACT

Option-equippable apparatus such as a computer that is not fully equipped with option circuit boards (14) has filler boards (15,16) connected to free board slots (13). In one embodiment, the filler boards (15) simulate the effect of circuit boards on airflow and act to evenly distribute the cooling air flow inside the computer cabinet (10) in order to provide improved cooling of the circuit boards. In another embodiment, the filler boards (16) block airflow between filler boards connected to adjacent board slots to direct more cooling airflow to any slots equipped with option circuit boards. The filler boards are made of electrically-conductive material (30) to absorb electromagnetic radiation emissions, and are covered with acoustically-absorbent material (33) to absorb sound emissions of the apparatus.

6 Claims, 3 Drawing Sheets

OPTION SLOT FILLER BOARD

TECHNICAL FIELD

This invention relates to apparatuses equippable with optional equipment, and to the flow with respect to such apparatuses of substances exhibiting fluid flow characteristics.

BACKGROUND OF THE INVENTION

Various apparatuses, particularly electical and electro-optical apparatuses such as computers, are designed to be operable in a minimum configuration that may be expanded by connection thereto of optional equipment such as option circuit boards. Such apparatuses often require flow past them of substances exhibiting fluid flow characteristics—air or water, for example—for purposes such as cooling or flushing. During hydraulic studies, we have discovered that the addition/removal of the optimal equipment to/from such apparatuses often undesirably affects the hydraulics—the flow patterns—of the substance. For example, an option board-equippable computer designed to exhibit an optimum cooling airflow pattern inside its cabinet when it is fully equipped with option boards typically does not exhibit that pattern—and hence may be inadequately cooled—when it is either wholly or partly unequipped with option circuit boards. It is a problem, therefore, to provide proper and adequate hydraulic flow patterns with respect to such apparatuses. Since an apparatus designer must design for the worst-case configuration of the apparatus, he or she must design for the unequipped configuration.

Often, such apparatuses also undesirably emit acoustic or electromagnetic energy, and it is a problem to limit such emissions.

SUMMARY OF THE INVENTION

The invention is directed to solving these and other problems and disadvantages of the prior art. According to the invention, an arrangement is provided that connects in place of the optional equipment in an option-equippable, but wholly or partly unequipped, apparatus and that affects the flow pattern of the substance flowing thereby in a manner substantially resembling or even duplicating the effect that would be produced by the optional equipment. The arrangement comprises an entity adapted for connection to a position that is provided in the apparatus for connection of the optional equipment. The entity is arranged, e.g., is sized and shaped, such that, when it is connected to the apparatus, it produces an effect on a substance moving past the entity which simulates the effect produced on the substance by the optional equipment when it is connected to the apparatus.

The use of the arrangement changes the worst-case condition from an option-unequipped to a fully option-equipped configuration. Therefore, the starting position for the designer—the worst-case configuration that he or she must consider—changes such that the variation in the design becomes smaller. Furthermore, the arrangement may be retrofitted into existing apparatus (of old design) to increase design safety margins.

Exemplarily, the apparatus is an electronic apparatus, such as a computer, that provides at least one slot, such as a backplane bus option board slot, for connection of an optional circuit package, such as an option circuit board. For use with this exemplary apparatus, the arrangement illustratively comprises an entity which, in one embodiment, is sized and shaped illustratively like the circuit package to produce an effect on a flow of a coolant, such as air, flowing past the entity when the entity is connected to the apparatus that simulates an effect produced on the coolant flow by the circuit package. In another embodiment, the entity is sized and shaped to block coolant flow between two adjacent slots when two of the entities are connected one to each of the two adjacent slots, in order to direct more cooling airflow to any slots equipped with option circuit boards.

Advantageously, the entity of this illustrative arrangement comprises an electrically-conductive material, for absorbing and hence reducing undesirable electromagnetic radiation emitted by the electronic apparatus.

Further advantageously, the entity of this illustrative arrangement comprises acoustically-absorbent material for absorbing sound generated by the apparatus, thereby causing the apparatus to run more quietly.

These and other advantages and features of the present invention will become apparent from the following description of an illustrative embodiment of the invention taken together with the drawing.

DETAILED DESCRIPTION

Figure 1:
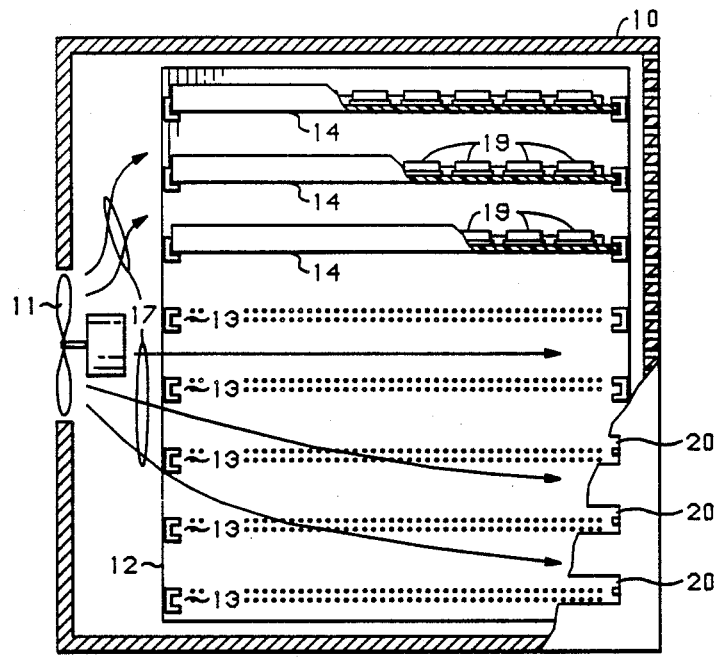
FIG. 1 is a simplified cutaway view of the inside of a cabinet of an option-board equippable, but not fully equipped, computer showing in simplified form the cooling airflow pattern therethrough.

FIG. 1 shows a simplified layout of the inside of an illustrative conventional computer cabinet 10. Cabinet 10 forms an enclosure for components of the computer. Mounted inside cabinet 10 is a backplane bus 12 having a plurality of slots 13 at which circuit packages, commonly referred to as circuit boards 14, may be connected thereto. In a basic configuration shown in FIG. 1, only three circuit boards 14 are connected to backplane 12, while five slots 13 of the total of eight slots 13 provided by bus 12 remain free to accept additional optional circuit boards 14 at a later time.

Mounted in a wall of cabinet 10 is a fan 11 that provides flow of cooling air across backplane 12 and circuit boards 14 connected thereto. The flowing air obeys the laws of hydraulics; that is, the airflow follows the path of least resistance. Accordingly, as suggested by arrows 17, the airflow pattern inside cabinet 10 is uneven, with proportionally more air tending to pass across a unit of area of backplane 12 in the area where no circuit boards 14 are connected.

Hence, more total cooling airflow must be provided to adequately cool the three circuit boards 14 in the computer equipped as shown in FIG. 1 than would be required if the airflow pattern was even. During hydraulic studies, it has been found that often the worst-case condition for cooling is not when cabinet 10 is fully eqipped with option boards 14 and hence generating maximum heat, but when cabinet 10 is wholly or partly unequipped with option boards 14, as shown in FIG. 1, wherein the uneven cooling airflow pattern results in localized overheating. Consequently, more total cooling airflow is often required to cool an unequipped or partially-equipped cabinet 10 than is required to cool a fully-equipped cabinet 10.

Providing for more cooling capacity involves either the use of a larger fan 11 with a correspondingly-larger motor to drive it, or the use of a faster-driven fan 11. The former solution adds bulk, weight, and cost to the computer, and both solutions tend to increase the acoustic energy (noise) generated by fan 11. The noise problem is exacerbated by the relative emptiness of the inside of cabinet 10 equipped as shown in FIG. 1, which tends to act as a resonator in the absence of circuit boards 14 to baffle the sound.

Figure 2:
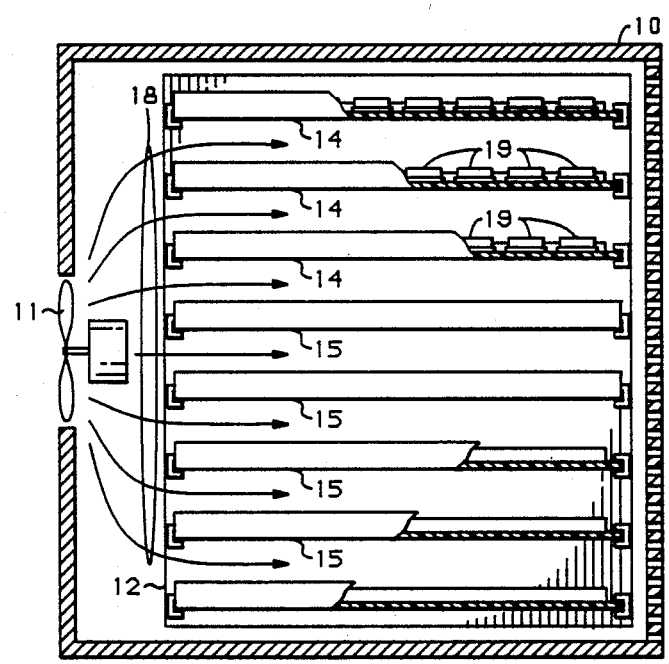
FIG. 2 is a cutaway diagram of the computer of FIG. 1 including a first illustrative embodiment of the invention.

FIG. 2 shows cabinet 10 of FIG. 1 equipped according to a first illustrative embodiment of the invention. Inserted into the previously-empty option board slots 13 are filler, or "dummy", boards 15. Physically, filler boards 15 resemble actual circuit boards 14 in size and shape. Filler boards 15 emulate the effect of boards 14 on coolant flow, that is, they effect the flow of cooling air past them in substantially the same manner as circuit boards 14. As suggested by arrows 18, filler boards 15 cooperate with circuit boards 14 to make the cooling airflow pattern inside cabinet 10 even, thereby causing more cooling air to flow over circuit boards 14 than in the example of FIG. 1. The effect produced on the airflow pattern by a filler board 15 simulates (e.g., closely resembles or even substantially duplicates) that produced by a circuit board 14. Hence, the airflow pattern in FIG. 2 substantially resembles that of cabinet 10 when fully equipped with circuit boards 14. Consequently, the total cooling airflow that must be provided by fan 11 in FIG. 2 is less than that required in FIG. 1. This allows for the use of either a smaller or a slower, and hence a quieter, fan 11.

When it becomes desirable to connect an option circuit board 14 to the computer of FIG. 2, a filler board 15 that occupies that circuit board's slot 13 is merely removed and the option circuit board 14 is connected to the now-free slot 13 in its place.

Figures 3, 4:
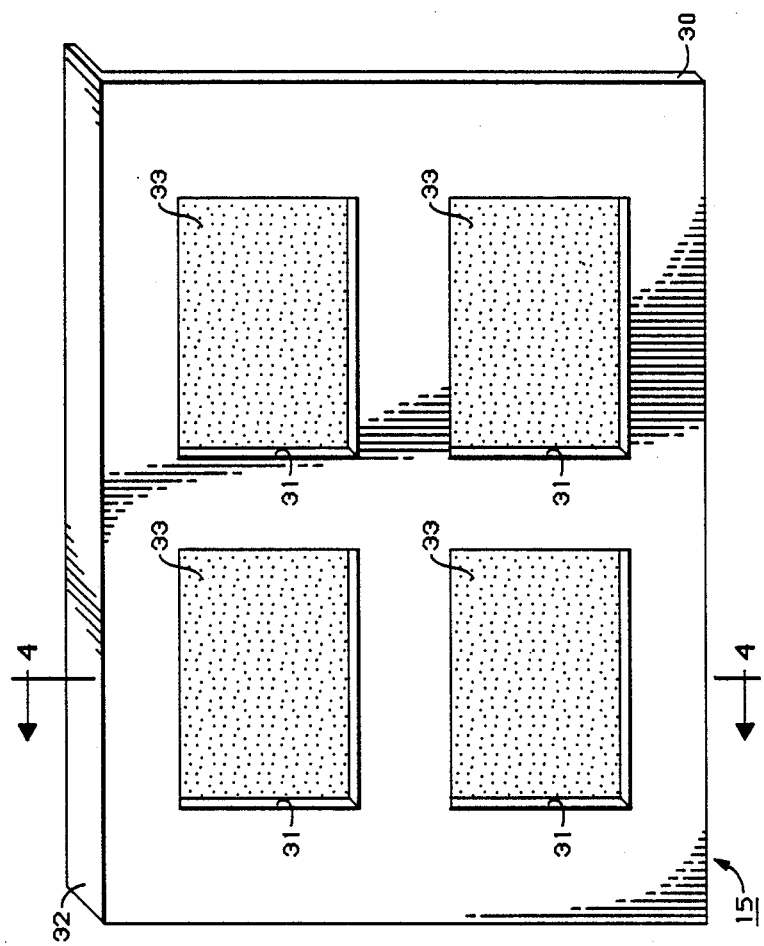
FIG. 3 is a perspective view of an option slot filler board of the computer of FIG. 2.
FIG. 4 is a sectional view of the board of FIG. 3 taken along the line 4—4.

FIG. 13 shows a perspective view of an illustrative filler board 15, while FIG. 4 shows a cross-sectional view of filler board 15 taken along the line 4—4 in FIG. 3. Board 15 comprises a plate or card 30 of rigid material that is sized and shaped along its periphery just like a circuit board 14, to permit insertion of board 15 into a slot 13 with the same ease and in the same manner as a board 14. Preferably, plate 30 is made of electroconductive material, such as aluminum, and is grounded on insertion into slot 13. This allows board 15 beneficially to serve as a sink for unwanted electromagnetic radiation emitted by equipment such as circuit boards 14 inside cabinet 10. Furthermore, plate 30 is "L"-shaped, with the wide edge 32 thereof being sized and shaped to completely close off option slot access hole 20 in the wall of cabinet 10. This further serves to prevent the escape of acoustic and electromagnetic energy from inside cabinet 10, and avoids the need to use separate access hole 20 closure plates.

Additionally, use of a rigid, such as a metal, plate 30 adds to the structural rigidity of cabinet 10 in substantially the same manner as would use of circuit boards 14. Hence, cabinet 10 need be designed for required structural strength only in a fully-equipped, as opposed to a partialy-equipped, configuration.

While circuit boards 14 have electronic components 19 mounted thereon, plate 30 of each filler board 15 has a sheet of acoustically-absorbent material 33, such as foam rubber or acoustically-tuned absorbers, mounted thereon. Material 33 serves to absorb sound generated inside cabinet 10, and hence makes the computer run more quietly. To maximize the area of material 33 that is exposed to sound, and thereby to maximize the sound-absorbing effect thereof, plate 30 is perforated with holes 31.

Figure 5:
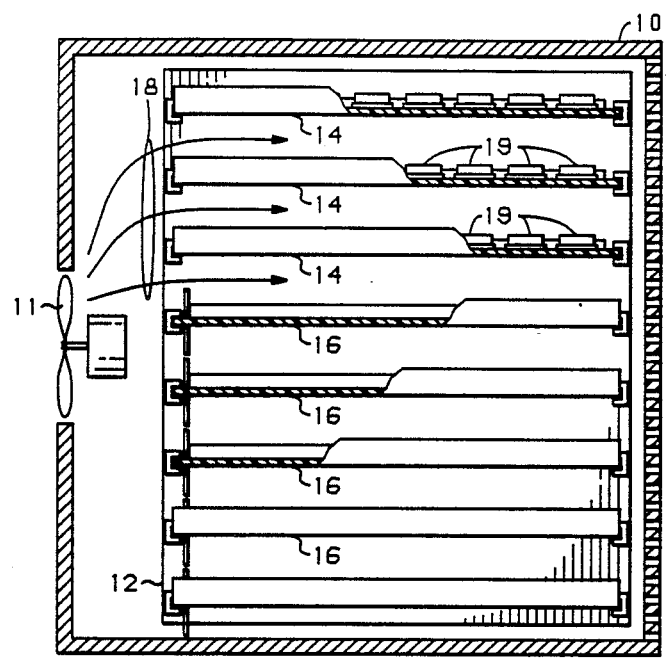
FIG. 5 is a cutaway diagram of the computer of FIG. 1 including a second illustrative embodiment of the invention.
Figure 6:
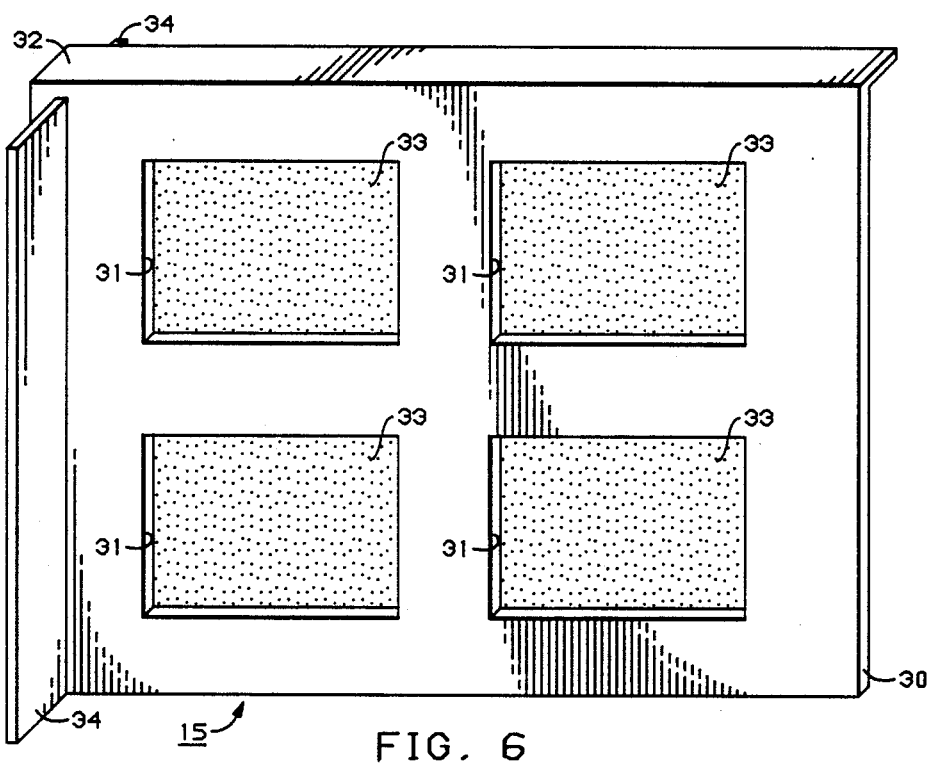
FIG. 6 is a perspective view of an option-slot filler board of the computer of FIG. 5.

FIG. 5 shows cabinet 10 of FIG. 1 equipped according to a second illustrative embodiment of the invention. Just as cabinet 10 is equipped with filler boards 15 in the embodiment of FIG. 2, cabinet 10 is equipped with filler boards 16 in the embodiment of FIG. 5. A filler board 16, shown in FIG. 6, substantially comprises a filler board 15 having transverse flanges 34 mounted on either side thereof along the edge thereof adjacent wide edge 32. Flanges 34 provide increased hydraulic resistance to airflow. Each flange 34 is approximately half as wide as the space between adjacent slots 13 in cabinet 10. Adjacent flanges 34 of adjacent filler boards 16 thus effectively close off the area between adjacent filler boards 16 in cabinet 10 and thus block air from flowing therethrough. Consequently, substantially all air moved by fan 11 is forced to flow past circuit boards 14, thereby increasing the cooling of boards 14. As this additional cooling of circuit boards 14 is not necessary, it becomes possible to slow down fan 11 so that it provides only as much cooling airflow to boards 14 in the embodiment of FIG. 5 as it does in the embodiment of FIG. 2. A slower-running fan produces less noise, and hence has the beneficial effect of making the computer run more quietly. Fan 11 may be slowed down either through manual intervention or automatically by means of circuitry that senses how many filler boards 16 are present in cabinet 10 and that adjusts fan 11 speed accordingly.

An alternative to using flanges 34 is to coat each side of plate 30 with an acoustical absorber to a depth approaching half the width of the space between adjacent slots 13.

Of course, it should be understood that various changes and modifications to the illustrative embodiment described above will be apparent to those skilled in the art. For example, in an apparatus wherein control of electromagnetic radiation emissions is not a problem, filler cards may be constructed of other material, such as cardboard. Such changes and modifications can be made without departing from the spirit and the scope of the invention and without diminishing its attendant advantages. It is therefore intended that all such changes and modifications be covered by the following claims.

What is claimed is:

1. An arrangement for use with an electronic apparatus providing a plurality of slots, each slot for connection to the apparatus of an optional circuit package,
the arrangement for connecting to a slot of the plurality of slots instead of the optional circuit package,
the arrangement being a dummy optional circuit package having protrusions extending therefrom toward adjacent slots across a direction of coolant flow to block the flow of the coolant between two adjacent slots when the arrangement and an identical arrangement are connected one to each of the two adjacent slots.

2. The arrangement of claim 1 comprising an electrically-conductive material for absorbing electromagnetic radiation emitted by the apparatus.

3. The arrangement of claim 1 comprising acoustically-adsorbent material for absorbing sound generated by the apparatus.

4. The arrangement of claim 1 comprising
a plate of electrically-conductive material for absorbing electromagnetic radiation emitted by the apparatus; and
acoustically-absorbent material covering at least one side of the plate for absorbing sound generated by the apparatus.

5. The arrangement of claim 4 wherein the plate defines openings therethrough to maximize exposure of surface area of the acoustically-absorbent material.

6. An arrangement comprising:
an electronic apparatus having an enclosure providing a plurality of slots each for connection of an optional circuit package to the apparatus inside the enclosure; and
at least one dummy entity each connected to a slot in place of the optional circuit package, and each dummy entity lacking circuitry of the optional circuit package and having protrusions extending therefrom toward adjacent slots across a direction of coolant flow to block the flow of the coolant through the enclosure between the adjacent slots when the entity and an identical entity are connected one to each of the two adjacent slots.

* * * * *